(12) United States Patent
Tanaka

(10) Patent No.: US 6,185,134 B1
(45) Date of Patent: Feb. 6, 2001

(54) FLASH MEMORY CONTROL METHOD, FLASH MEMORY SYSTEM USING THE CONTROL METHOD AND FLASH MEMORY DEVICE USING THE CONTROL METHOD

(75) Inventor: Tomoharu Tanaka, Yokohama (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 09/456,340

(22) Filed: Dec. 8, 1999

(30) Foreign Application Priority Data

Dec. 10, 1998 (JP) .................................................. 10-351435

(51) Int. Cl.[7] .................................................. G11C 16/04

(52) U.S. Cl. ...................... 365/185.33; 365/241; 365/236

(58) Field of Search ..................................... 365/190, 218, 365/185.04, 200, 236, 238.5, 241, 185.33

(56) References Cited

U.S. PATENT DOCUMENTS

| 5,361,227 | 11/1994 | Tanaka et al. . |
| 5,396,468 | * 3/1995 | Harari et al. .......................... 365/218 |
| 5,504,760 | * 4/1996 | Harari et al. .......................... 371/40.1 |
| 5,822,256 | * 10/1998 | Bauer et al. ......................... 365/200 |

* cited by examiner

Primary Examiner—David Nelms
Assistant Examiner—Thong Le
(74) Attorney, Agent, or Firm—Hogan & Hartson, LLP

(57) ABSTRACT

A method of correcting errors of a flash memory comprises steps of modifying the data of a group of memory units, each having a plurality of flash memory cells adapted to erasing data therefrom and writing data therein, checking for the presence or absence of an error of not properly modifying the data of the group of memory units and determining the completion of proper modification of the data of the group of memory units provided that an error is detected and the error can be corrected.

30 Claims, 8 Drawing Sheets

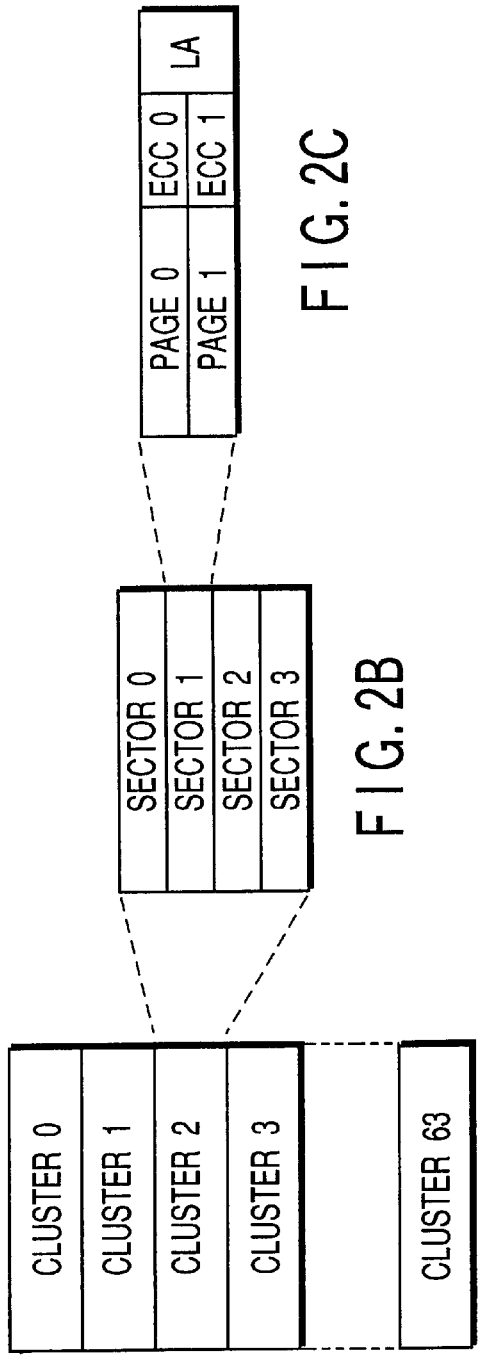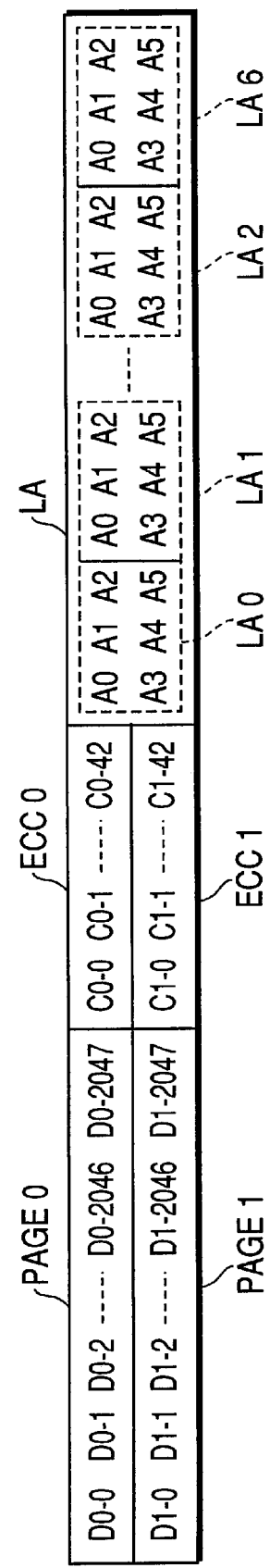

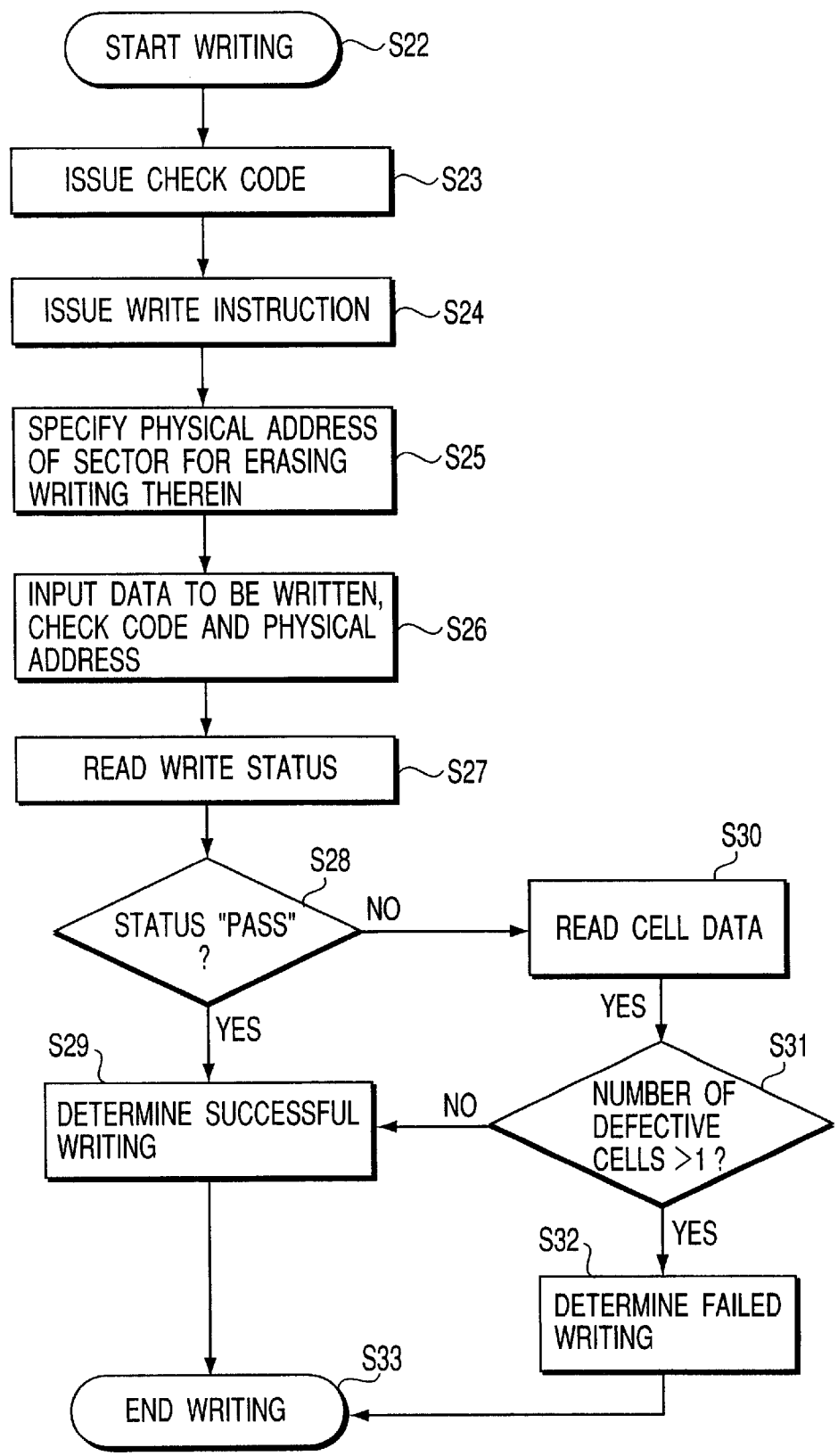
F I G. 11

FLASH MEMORY CONTROL METHOD, FLASH MEMORY SYSTEM USING THE CONTROL METHOD AND FLASH MEMORY DEVICE USING THE CONTROL METHOD

BACKGROUND OF THE INVENTION

This invention relates to a method of controlling a flash memory. It also relates to a flash memory system and a flash memory device using such a control method.

Hard disk devices are popularly used as computer memory devices that are available at low cost relative to the memory capacity they provide. In many hard disks, file data are written and read out on a unit by unit basis and the unit is referred to as sector (e.g., 512 bytes).

Hard disks can give rise to errors due to a scar and/or particles of dirt that make it no longer possible to carry out the normal operation of writing data into or retrieving data from a sector. However, such errors can be detected and corrected by adding an annex data referred to as error check code to each file data. With the use of an error check code, the presence or absence of an error in a file data can be detected by using the file data and the error check code. If there is an error, then it can be corrected.

In many file management systems that are used for computers, a larger unit is formed by a plurality of sectors so that file data are mostly controlled on a cluster basis on the computer.

A hard disk consumes electric power at a relatively high rate for driving its motor. Additionally, vibrations generated by the motor can damage the disk and hence its reliability. Flash memories are introduced to bypass this problem. A flash memory consumes power at a lower rate and can withstand vibrations. Additionally, it does not require a power back up system comprising batteries. Thus, flash memories are popularly used in portable electronic equipment.

As far as this patent application is concerned, a memory device using a flash memory is referred to as flash memory system. In many instances, a flash memory is designed to operate just like a hard disk from the viewpoint of computer.

In other words, a flash memory system is operated in such a manner that a hard disk driver is driven for operation. This is because it is a great advantage for any computers to be able to access a hard disk and a flash memory without discrimination.

To do this, the computer is required to be able to write data into and read data from a flash memory on a sector basis. In other words, a flash memory is required to be provided with a data register that can temporarily store data by a volume to be collectively stored in a sector. Then, a volume of data to be written into and read from a sector will be collectively handled by the computer. This technique is well known and a system adapted to collectively write data into and read data from a sector can operate at high speed.

NAND type flash memories are known to be particularly adapted to the above technique. With an NAND type flash memory, for instance, data can be collectively written into and read from a sector by 528 bytes and four sectors may form a cluster. Then, data can be collectively erased on a cluster by cluster basis.

When the data stored in a cluster are erased in a flash memory system comprising an NAND type flash memory, the computer checks if all the data in the memory cells of the cluster have been erased or not (an operation including VERIFY/ERASE). If there is a memory cell in the cluster where a data has not been erased and remains there, the cluster is deemed as faulty and the cluster is disabled.

Similarly, when data are written into a sector, the computer checks if data are written correctly into all the memory cells or not (an operation including VERIFY/WRITE). If there is a memory cell in the sector where a data cannot be written, the sector is deemed as faulty and the cluster containing the sector is disabled.

Redundant clusters are provided in order to replace disabled clusters. When the number of disabled clusters exceeds a given level, it is no longer possible to replace a disabled cluster and the entire flash memory becomes faulty.

Multi-valued NAND type flash memories where a plurality of threshold voltages, e.g., four threshold voltages, are provided for each memory cell and a 2-bit data is written there are known. Such flash memories require a rigorous control of threshold voltage values far more than any ordinary NAND type flash memories. Thus, such flash memories can show a higher rate of appearance of faulty memory cells than any ordinary NAND type flash memories because their data retaining performance can often degrade.

In view of this problem, flash memory systems comprising a multi-valued NAND type flash memory are required to reliably detect and correct errors. When the data stored in a cluster are erased in such a flash memory system, the computer also checks if all the data in the memory cells of the cluster have been erased or not (an operation including VERIFY/ERASE). If there is a memory cell in the cluster where a data has not been erased and remains there, the cluster is deemed as faulty and the cluster is disabled.

Similarly, when data are written into a sector, the computer checks if data are written correctly into all the memory cells or not (an operation including VERIFY/WRITE). If there is a memory cell in the sector where a data cannot be written, the sector is deemed as faulty and the cluster containing the sector is disabled.

As described above, because of the provision of error check codes that are annexed to data in a system where a plurality of memory cells can be checked for error detection and error correction, only a single faulty memory cell disables the entire cluster for any operation of erasing and writing data before the system operates in an error detection/correction mode.

In other words, while the memory system may be relieved of a faulty condition, it can often give rise to a faulty sector or a faulty cluster and consequently a large disabled memory area that can leads to a system fault.

In view of the above identified circumstances, it is therefore the object of the present invention to provide a flash memory system that can correct errors in such a way that any unnecessary expansion of disabled memory areas is effectively prevented.

BRIEF SUMMARY OF THE INVENTION (1) A method of controlling a flash memory system according to the present invention comprises: modifying the data of a group of memory units, each having a plurality of flash memory cells adapted to erasing data therefrom and writing data therein; checking for the presence or absence of an error of not properly modifying the data of the group of memory units; and determining the completion of proper modification of the data of the group of memory units provided that an error is detected and the error can be corrected.

(2) A method of controlling a flash memory system according to the present invention comprises: erasing the data written in a group of memory units, each having a plurality of flash memory cells adapted to erasing data therefrom and writing data therein; reading the data written in the group of memory units having the data erased and checking the completion of proper erasure of the data; counting the number of errors of not being properly erased provided that the data are not properly erased as a result of the checking step; and determining the completion of proper erasure of the data of the group of memory units provided that the counted number of errors is within a correctable range.

(3) A method of controlling a flash memory system according to the present invention comprises: writing data in a group of memory units, each having a plurality of flash memory cells adapted to erasing data therefrom and writing data therein; reading the data written in the group of memory units and checking the completion of proper writing of the data; counting the number of errors of not being properly written provided that the data are not properly written as a result of the checking step; and determining the completion of proper writing of the data of the group of memory units provided that the counted number of errors is within a correctable range.

(4) A flash memory system according to the present invention comprises: a group of memory units, each having a plurality of flash memory cells adapted to erasing data therefrom and writing data therein; an error detection/correction unit for reading the data written in the group of memory unit and detecting/correcting errors up to a predetermined number; an error judgement section for counting the number of errors detected by the error detection/correction unit and determining the completion of proper data modification of data provided that the number of errors detected by the error detection/correction unit is not greater than the predetermined number.

(5) A flash memory system according to the present invention comprises: a memory cluster having a plurality of flash memory cells adapted to erasing data therefrom and writing data therein; at least one or more than one memory sectors constituting the memory cluster; a flash memory control unit for ordering erasure of the data written in the memory cluster; an error detection/correction unit for detecting erase errors in the data read from the memory cluster and correcting erase errors up to n attributable to memory cells; an error judgement section for counting the erase errors of each memory sector and determining the completion of proper data erasure provided that the number of memory cells storing unerased data is not greater than m ($1 \leq m \leq n$) in each and every memory sector.

(6) A flash memory system according to the present invention comprises: a memory cluster having a plurality of flash memory cells adapted to erasing data therefrom and writing data therein; at least one or more than one memory sectors constituting the memory cluster; a flash memory control unit for ordering erasure of the data written in the memory cluster; an error detection/correction unit for detecting erase errors in the data read from the memory cluster and correcting erase errors up to n symbols (1 symbol=k bits, $k \geq 2$) attributable to the data; a counter unit for counting the number of symbols showing erase errors and contained in each memory sector; an error judgement section for determining the completion of proper data modification provided that the number of symbols showing erase errors is not greater than m ($1 \leq m \leq n$) in each and every memory sector.

(7) A flash memory system according to the present invention comprises: a memory cluster comprising a plurality of external flash memory cells; at least one or more than one memory sectors constituting the memory cluster; a flash memory control unit for ordering writing of the data in the memory sectors; an error detection/correction unit for detecting errors in the data read from the memory cluster and correcting erase errors up to n attributable to flash memory cells; an error judgement section for counting the number of memory cells defective in terms of writing and contained in each memory sector and determining the completion of proper data writing provided that the number of memory cells defective in terms of writing is not greater than n in each and every memory sector.

(8) A flash memory system according to the present invention comprises: memory sectors having a plurality of flash memory cells; a flash memory control unit for ordering writing of the data in each of the memory sectors; an error detection/correction unit for detecting write errors in the data read from the memory cluster and correcting write errors up to n symbols (1 symbol=k bits, $k \geq 2$) attributable to the data; an error judgement section for counting the number of symbols defective in terms of writing as detected by the detection unit aid and determining the completion of proper data modification provided that the number of symbols showing errors is not greater than m ($1 \leq m \leq n$) in each and every memory sector.

(9) A flash memory system according to the present invention comprises: a memory cluster comprising a plurality of external flash memory cells; at least one or more than one memory sectors constituting the memory cluster; a flash memory control unit for ordering writing of the data in the memory sectors; an error detection/correction unit for detecting write errors in the data read from the memory cluster and correcting write errors up to n bits attributable to the data; an error judgement section for counting the number of bits showing write errors and determining the completion of proper data writing provided that the number of bits showing write errors is not greater than m ($1 \leq m \leq n$) bits in each and every memory sector.

As well as the above-described methods, the functions of the error judgment section and the error detection/correction unit can be also realized, using a computer-readable recording medium that stores programs for enabling the computer to execute predetermined functions.

Further, the invention related to a method for controlling a flash memory system can be realized by a computer-readable recording medium, which stores programs for enabling the computer to execute a procedure corresponding to the method invention.

In the invention, data erasion or writing is determined to have succeeded if errors that have occurred in memory cells during erasion or writing are less than a predetermined correctable amount. This structure enables the provision of an error-correctable flash memory system which prevents an excessive increase in unusable memory area.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A through 2C are schematic illustrations of a possible configuration of the cell array 10 in FIG. 1.

FIG. 7 is a schematic illustration of a possible data arrangement in a sector of a flash memory cell array.

FIG. 11 is a flow chart of the algorithm of the operation of the memory system of FIG. 1 in a write mode, the flow chart being applicable to the fifth embodiment of the invention.

DETAILED DESCRIPTION OF THE INVENTION

Now, the present invention will be described by referring to the accompanying drawing that illustrates preferred embodiments of the invention.

[1st Embodiment]

Figure 1:
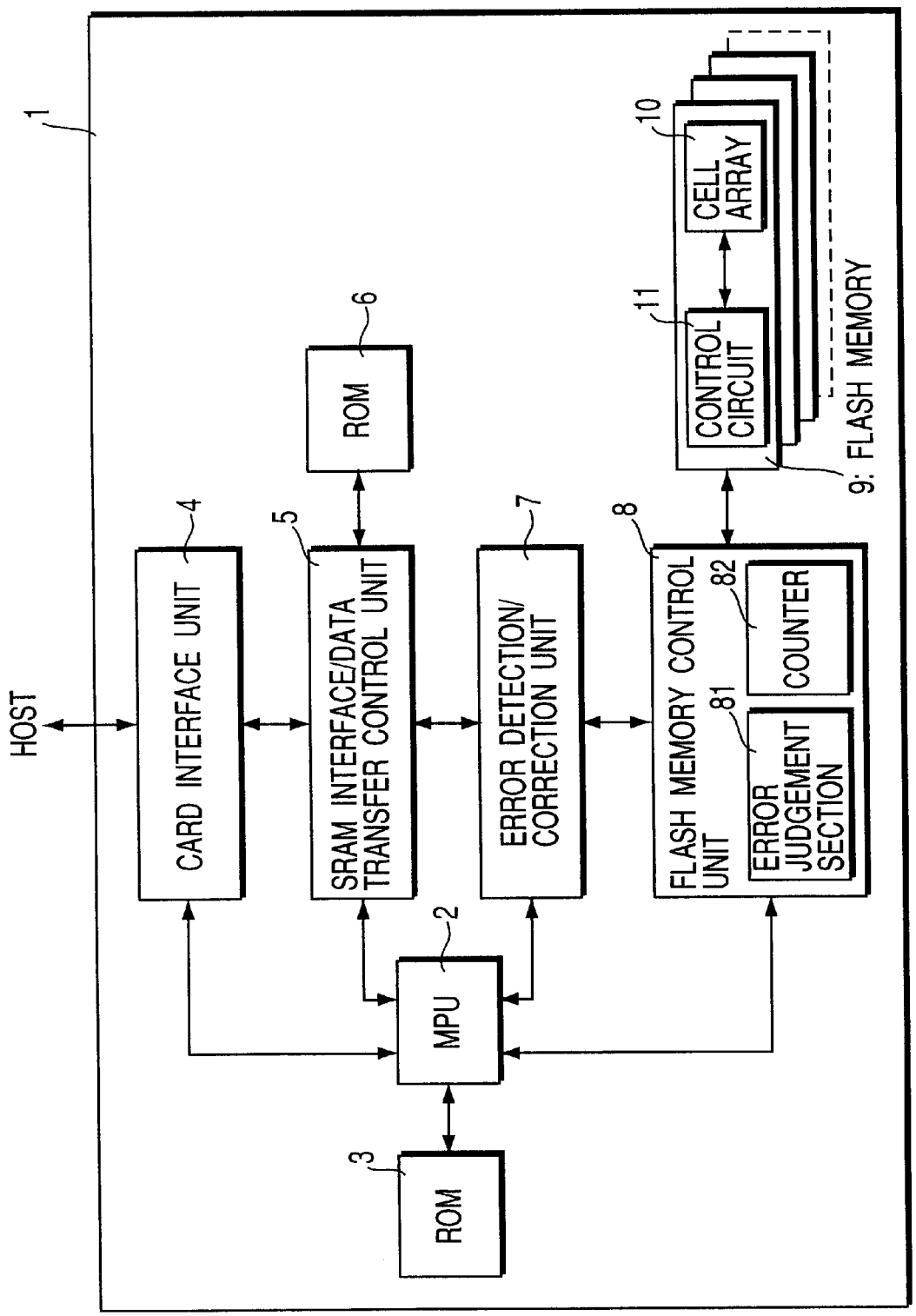
FIG. 1 is a schematic block diagram of the first embodiment of flash memory system according to the invention and adapted to effectively correct errors, showing the configuration of a flash memory card used in the system.

FIG. 1 is a schematic block diagram of the first embodiment of flash memory system according to the invention and adapted to effectively correct errors, showing the configuration of a flash memory card used in the system. Flash memory card 1 is controlled by instructions from MPU (microprocessor unit) 2 and the host computer.

ROM (read only memory) 3 stores a control program written in there. The MPU 2 controls card interface unit 4 that is adapted to read programs from the ROM 3 and exchange data with the host computer, SRAM (static random access memory) interface/data transfer control unit 5, error detection/correction unit 7 and flash memory control unit 8.

The flash memory control unit 8 has an error judgement section 81, which error judgement section 81 allows errors in a data erase or data write mode of operation of flash memory 9 so long as the error detection/correction unit 7 can correct the errors by means of a given algorithm so that the system is then deemed to be allowing the errors and properly operating for erasing or writing data.

Now, the operation of writing and erasing data of the card system of FIG. 1 will be described. The data transmitted from the host computer is sent to the SRAM interface/data transfer control unit 5 by way of the card interface unit 4. The SRAM interface/data transfer control unit 5 sends the data to the error detection/correction unit 7.

The error detection/correction unit 7 generates check codes (error check codes) necessary for error detection/correction when the data is read out. The data and the check code are then sent from the flash memory control unit 8 to the flash memory 9 and written into the latter. If necessary, the flash memory control unit 8 issues an erase instruction to the flash memory 9 before writing said data including the check codes to erase the data stored in the memory.

In the flash memory 9, control circuit 11 receives the data and writes it at the specified physical address of the memory cell array 10 of the flash memory 9. Then, the control circuit 11 checks if the write operation has been carried out or not and, if it determines that the write operation has been carried out successfully, it sends status information of "pass" back to the flash memory control unit 8.

A similar procedure is followed for an erase operation. The control circuit 11 checks if the erase operation has been carried out or not and, if it determines that the erase operation has been carried out successfully, it sends status information of "pass" back to the flash memory control unit 8.

Upon receiving the "pass", the flash memory control unit 8 sends the information that the erase or write operation has been carried out successfully to the MPU 2.

If, on the other hand, the control circuit 11 determines that the erase or write operation has not been carried out successfully, it sends status information of "fail" back to the flash memory control unit 8. Upon receiving the "fail", the flash memory control unit 8 issues an instruction to the flash memory 9 to make the latter output information on the error condition.

Thus, the flash memory control unit 8 receives information on the error condition from the flash memory 9 for the "fail". If it determines that the error can be corrected on the basis of a given algorithm as a result of reading the information on the error condition, it sends information that the erase or write operation has been carried out successfully to the MPU 2.

If, on the other hand, it determines that the error cannot be corrected on the basis of a given algorithm as a result of reading the information on the error condition, it sends information that the erase or write operation has failed to the MPU 2.

Then, the MPU 2 disables the related physical address in response to the information that the erase or write operation has failed. Additionally, the MPU 2 replace the physical address with a spare physical address and tries the erase or write operation for another time.

Now, the operation of reading data of the card system of FIG. 1 will be described below. As a read instruction is issued from the host computer to the card interface unit 4, the MPU 2 by turn issues a read instruction to the unit 8, which then issues a same read instruction to the flash memory 9.

In the flash memory 9, the control circuit 11 reads the data of the specified physical address of the memory cell array 10 of the flash memory 9 and outputs it to the flash memory control unit 8. The read out data is then sent to error detection/correction unit 7, which checks if the data contains an error or not by means of the check code annexed to it.

If it is determined that the data read out from the flash memory 9 contains no error as a result of the check, the data from which the check code is removed is output to the host computer by way of the SRAM interface/data transfer control unit 5 and card interface unit 4.

If, on the other hand, it is determined that the data read out from the flash memory 9 contains an error but the error can be corrected as a result of the check, the error of the data is corrected by the error detection/correction unit 7 and then output to the host computer. If it is determined that the error cannot be corrected as a result of the check, the MPU 2 outputs information that the read operation has failed to the host computer by way of the card interface 2.

Upon receiving a second data from the host computer and if the operation of processing the preceding first data has not been finished yet, the SRAM 6 temporarily stores the second data. Likewise, if a data is output to the host computer but the latter is not ready for receiving the data, the SRAM 6 also temporarily stores the output data.

FIGS. 2A through 2C are schematic illustrations of a possible configuration of the cell array 10 of FIG. 1. The cell array is divided into a plurality of memory clusters (hereinafter referred to as clusters). In the illustrations, the cell array 10 is divided into 64 clusters (FIG. 2A).

A cluster is constituted by one or more than one memory sectors (hereinafter referred to as sectors). In the illustrations, each cluster is constituted by 4 sectors (FIG. 2B). A cluster is used as a unit of erasure and a sector is used as a unit for writing or reading data. In currently available computers, a sector is normally used for storing 512 bytes of data and a cluster is normally used for storing several to tens of several thousand bytes of data.

The data sent from the host computer and the check code generated for the data by the error detection/correction unit 7 are stored in a sector along with the related logical address of the file management system of the host computer. In this instance, the data is stored on page 0 and page 1 and the check code is stored in ECC0 and ECC1, while the logical address is stored in LA (FIG. 2C).

Thus, this embodiment does not simply disables a faulty cluster of the flash memory 9 simply according to status information of "fail" and determines if the system can be relieved of the failure or not so that the system adapted to error detection and error correction can be effectively exploited.

Therefore, this embodiment can effectively prevent a defective sector or a defective cluster from appearing before the system enters an error detection/correction mode of operation if such a defect can be remedied by the system. As a result, the embodiment can effectively suppress any unnecessary increase of the disabled memory area of the memory system and reduce the frequency of occurrence of system failure.

While the error judgement section 81 is included in the flash memory control unit 8 in the above description of the embodiment, it may alternatively be included in some other unit. The error judgement section 81 counts, using a counter 82, errors which may occur in each of data erasing and writing modes in the flash memory 9. If the number of errors falls within a range in which the error detection/correction unit 7 can correct them in accordance with a predetermined algorithm, the error judgement section 81 permits the existence of the errors and judges that normal erasion or writing has been executed.

Now, some of the advantages of the invention will be discussed by referring to FIGS. 3 through 5.

Figure 3:
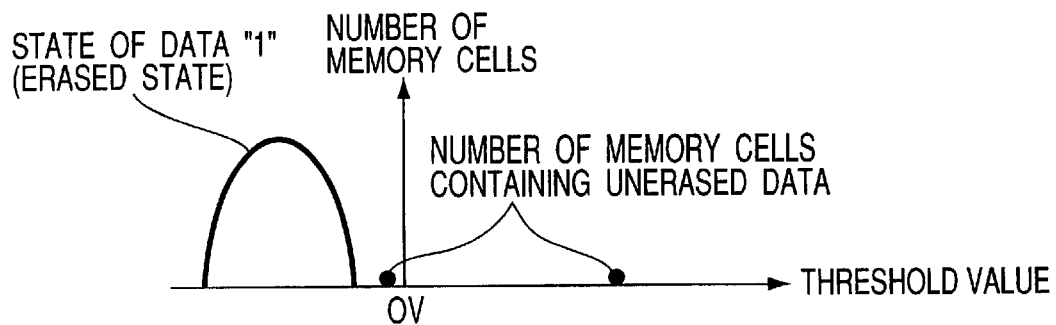
FIG. 3 is a graph showing the distribution of threshold values of a flash memory cluster after erasing data.

FIG. 3 is a graph showing the distribution of threshold values of a flash memory cluster after erasing data. The threshold value is brought down below a predetermined level (in a data "1" state) by an erase operation (an operation including VERIFY/ERASE) in the flash memory.

However, there may arise an occasion where data cannot be erased from one or more than one memory cells as indicated by black spots in FIG. 3. Conventionally, such an error is handled as erase failure.

Figure 4:
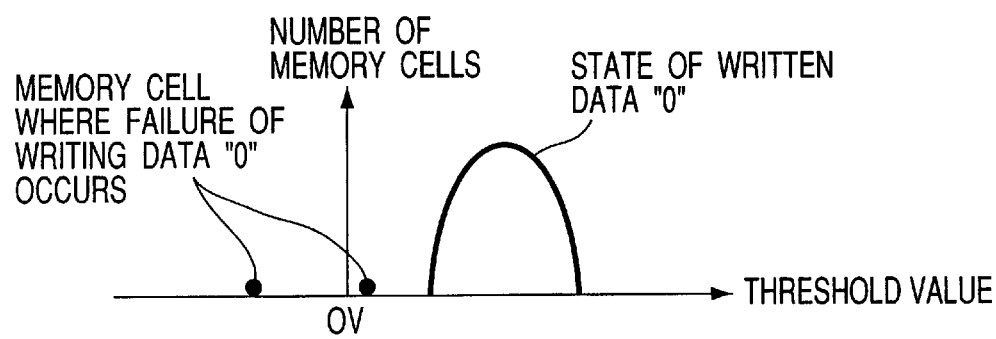
FIG. 4 is a graph showing the distribution of threshold values of a flash memory sector after writing data.

FIG. 4 is a graph showing the distribution of threshold values of a flash memory sector after writing data. The through value is brought up above a predetermined level by a write operation (an operation including VERIFY/WRITE) in the flash memory.

However, there may arise an occasion where data cannot be written in one or more than one memory cells as indicated by black spots in FIG. 4. Conventionally, such an error is handled as write failure.

In other words, in conventional systems, the cluster including the memory cells that produced an error is disabled. Therefore, if it is possible to remedy such an error in the system by means of the error detection/correction unit 7 (as shown in FIG. 1), the cluster to which the memory cells that produced an error belong is deemed as defective and disabled before the system enters an error detection/correction mode of operation.

To the contrary, according to the invention, it is firstly determined if the error can be remedied by the system or not. Therefore, if most of the memory cells of the cluster operate properly and an error detecting/correcting operation can be successfully carried out on all of the several memory cells of the cluster that gave rise to the error, the cluster is not disabled but utilized as normal cluster in the system.

Figure 5:
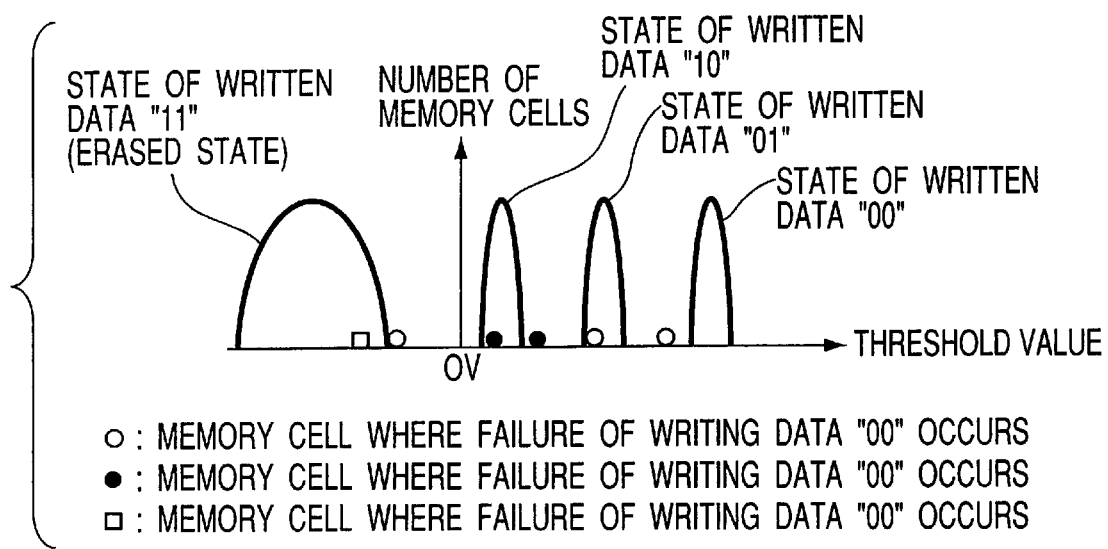
FIG. 5 is a graph showing the distribution of threshold values of a flash memory using a 4-valued memory system for storing 2-bit data in a memory cell.

FIG. 5 is a graph showing the distribution of threshold values of a flash memory using a 4-valued memory system for storing 2-bit data in a memory cell. As seen from FIG. 5, the width of each of the threshold ranges for each data is narrower than that of the threshold range of a 2-valued memory system for storing 1-bit data. Then, the probability of producing a write error will be higher in a 4-valued memory system than in a 2-valued memory system.

The present invention is particularly effective for such a flash memory. When an error as shown in FIG. 5 occurs in a flash memory according to the invention, it determines if the failure can be remedied by the system or not. If it is determined that most of the memory cells of a cluster operate properly and an error detecting/correcting operation can be successfully carried out on all of the several memory cells of the cluster that gave rise to an error, the cluster is not disabled but utilized as normal cluster in the system.

Thus, any failure that can be remedied by the system are not regarded as such so that any unnecessary increase of the disabled memory area of the memory system can effectively be suppressed to consequently reduce the frequency of occurrence of system failure.

[2nd Embodiment]

Figure 6:
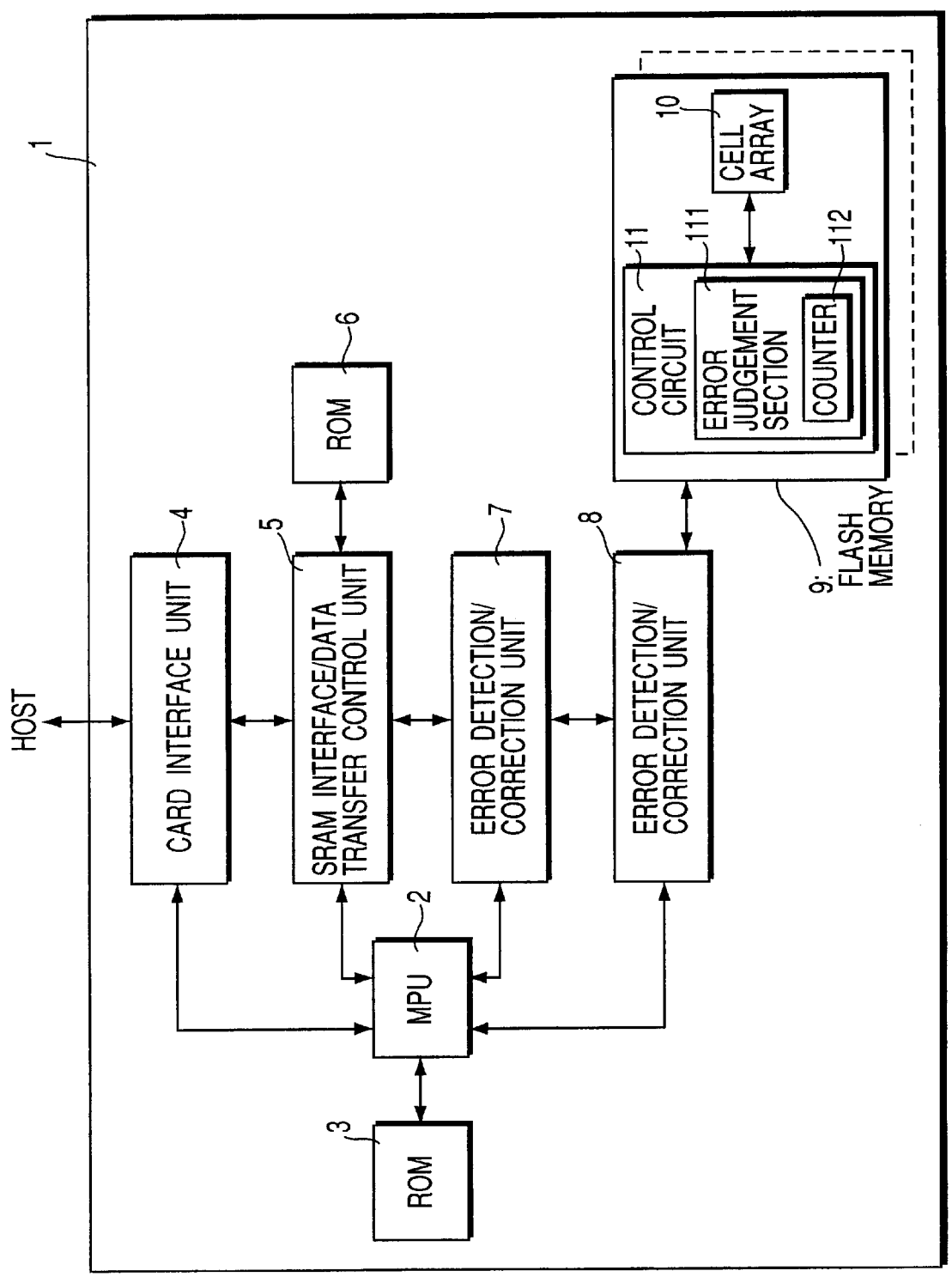
FIG. 6 is a schematic block diagram of a flash memory system according to the invention and adapted to effectively correct errors, showing the configuration of a flash memory card used in the system, the block diagram being applicable to the second through fourth embodiments of the invention.

FIG. 6 is a schematic block diagram of the second embodiment of flash memory system according to the invention and adapted to effectively correct errors, showing the configuration of a flash memory card used in the system, the block diagram being applicable to the second through fourth embodiments of the invention. In the FIG. 1 case, the error judgement section (81) operates in the flash memory control unit 8, while in the FIG. 6 case, an error-counting counter 112 operates in the control circuit 11 incorporated in the flash memory 9. Otherwise, the second embodiment has a configuration similar to that of the first embodiment and hence the components thereof are denoted by the same reference symbols.

Flash memory card 1 is controlled by instructions from MPU (microprocessor unit) 2 and the host computer. ROM (read only memory) 3 stores a control program written in there. The MPU 2 controls card interface unit 4 that is adapted to read programs from the ROM 3 and exchange data with the host computer, SRAM (static random access memory) interface/data transfer control unit 5, error detection/correction unit 7 and flash memory control unit 8.

In the flash memory control unit 8, control circuit 11 receives a data and carries out an erase, write or read operation at the specified physical address in the memory cell array 10.

The control circuit 11 includes error judgement section 111. The error judgement section 111 counts, using a counter 112, errors which may occur in each of data erasing and writing modes. If the number of errors falls within a range in which the error detection/correction unit 7 can correct them in accordance with a predetermined algorithm, the error judgement section 111 permits the existence of the errors and judges that normal erasion or writing has been executed.

FIG. 7 is a schematic illustration of a possible data arrangement in a sector of a flash memory cell array, showing the configuration of sectors in the cell array 10 of the flash memory 9. In other words, FIG. 7 shows a data arrangement in the cell array 10 of FIG. 2C.

In this embodiment, a 4-valued memory system is used to store a 2 bits data in each memory cell of the flash memory. As shown in FIG. 7, data D0-x and data D1-x (x=0, 1, . . . , 2047) are paired and stored in a memory cell. FIG. 5 shows the state of written data "11", that of written data "10", that of written data "01" and that of written data "00", one of which represents the state of each memory cell of the flash memory.

Additionally, error check code C0-y and error check code C1-y (y=0, 1, . . . , 42) are paired as shown in the column indicated by ECC in FIG. 7 and stored in a memory cell (hereinafter error check code is referred to as check code). Check codes C0-y and C1-y are generated in error detection/correction unit 7 in FIG. 6. Check code C0-y is annexed to data D0-0 through D0-2047 so as to be able to correct errors for n bits by means of a given error correction algorithm. Similarly, check code C1-y is annexed to data D1-0 through D1-2047 so as to be able to correct errors of n bits by means of a given error correction algorithm.

Thus, if n memory cells become defective in the above embodiment, the n errors can successfully be corrected. The number of bits that can be remedied is limited by the check code length. While the check code length is equal to 43 bits in the above instance, the number of bits that can be remedied can be made greater than 43 by increasing the number of memory cells if necessary.

Logical addresses A0 through A5 in each of LA0 through LA6 are stored in three memory cells. In other words, 7 sets of same address data (LA0 through LA6) are provided. As a result, up to 3 bits can be corrected for an address data Az (z=0 through 5) on the basis of majority logic (the boarder line being defined by 4:3). Thus, it will be appreciated that up to 3 defective memory cells can be remedied. The number of correctable bits can be increased by increasing the number of address data sets.

Keeping the above discussed data arrangement in mind, now a principal part of the second embodiment will be described below by referring to FIGS. 2A through 2C, FIG. 6 and FIG. 7.

The control circuit 11 erases the cluster in question and checks the erased state of the cluster (an operation including VERIFY/ERASE).

After the erasing operation, if the control circuit 11 determines that there are one or more than one sectors that contain m ($2 \leq m \leq n+1$) or more than m memory cells where the stored data have not been erased or there can be one or more than one sectors that contain m ($2 \leq m \leq n+1$) or more than m memory cells where the stored data has not been erased, it concludes that the normal erase operation has not been carried out successfully for the cluster and sends a "fail" status message back to the flash memory control unit 8.

For example, if n=2 and m=3, the system can correct errors of up to three memory cells for each sector. Assume here that each sector is allowed to make a memory cell error at the time of an erase operation so that the operation is carried out as normal erase operation. Then, if any of the sectors has a single error, the control circuit 11 sends status information of "pass" back to the flash memory control unit 8.

While errors of up to three memory cells are allowed in this embodiment, it is actually so arranged that only a memory cell error is allowed there in order to provide a degree of redundancy for accommodating data errors that may arise as the system degrades with time.

The control circuit 11 writes data in sectors and check the written state of each of the sectors (including an optical of VERIFY/WRITE). If the control circuit 11 determines that there are m ($2 \leq m \leq n+1$) or more than m memory cells where a data has not been written or there can be m ($2 < m < n+1$) or more than m memory cells where a data has not been written, it concludes that the normal write operation has not been carried out successfully for the sector and sends a "fail" status message back to the flash memory control unit 8.

For example, if n=2 and m=3, the system can correct errors of up to three memory cells for each sector. Assume here that each sector is allowed to make a memory cell error at the time of an write operation so that the operation is carried out as normal write operation. Then, if any of the sectors has a single error, the control circuit 11 sends status information of "pass" back to the flash memory control unit 8.

Now, a third embodiment of the invention will be described also by referring to FIGS. 2A through 2C, FIG. 6 and FIG. 7. In this embodiment, a 4-valued memory system is used to store a 2 bits data in each memory cell of the flash memory. As shown in FIG. 7, data D0-x and data D1-x (x=0, 1, . . . , 2047) are paired and stored in a memory cell.

In this embodiment, the error detection/correction unit 7 divides data into a plurality of groups (symbols) for so many memory cells and generates check codes C0-1 through C0-42 and C1-1 through C1-42 so that n symbols may be corrected. Popular Reed-Solomon codes may be used for them.

With this arrangement, errors can be corrected if up to the number of memory cells equal to that of n symbols become defective. The number of symbols that can be corrected is limited by the check code length. While the check code length is equal to 43 bits in the above instance, the number of correctable symbols can be made greater than 43 by increasing the number of memory cells if necessary.

Logical addresses A0 through A5 in each of LA0 through LA6 are stored in three memory cells. In other words, 7 sets of same address data (LA0 through LA6) are provided. As a result, up to 3 bits can be corrected for an address data Az (z=0 through 5) on the basis of majority logic. Thus, it will be appreciated that up to 3 defective memory cells can be remedied. The number of correctable bits can be increased by increasing the number of address data sets.

Keeping the above discussed data arrangement in mind, now a principal part of the third embodiment will be described below by referring to FIGS. 2A through 2C, FIG. 6 and FIG. 7.

The control circuit 11 erases the cluster in question and checks the erased state of the cluster (an operation including VERIFY/ERASE).

After the erasing operation, if the control circuit 11 determines that there are one or more than one sectors that contain errors equal to m ($2 \leq m \leq n+1$) or more than m symbols or there can be one or more than one sectors that contain errors equal to m ($2 \leq m \leq n+1$) or more than m symbols, it concludes that the normal erase operation has not been carried out successfully for the cluster and sends a "fail" status message back to the flash memory control unit 8.

For example, if n=2 and m=3, the system can correct errors of up to three symbols errors for each sector. Assume here that each sector is allowed to make a symbol error at the time of an erase operation so that the operation is carried out as normal erase operation. Then, if any of the sectors has a single symbol error, the control circuit 11 sends status information of "pass" back to the flash memory control unit 8.

The control circuit 11 writes data in sectors and check the written state of each of the sectors (including an optical of VERIFY/WRITE). If the control circuit 11 determines that there errors equal to m ($2 \leq m \leq n+1$) symbols or more than m or there can be errors equal to m ($2 \leq m \leq n+1$) or more than m symbols, it concludes that the normal write operation has not been carried out successfully for the sector and sends a "fail" status message back to the flash memory control unit 8.

For example, if n=2 and m=3, the system can correct up to three symbol errors for each sector. Assume here that each sector is allowed to make a symbol error at the time of an write operation so that the operation is carried out as normal write operation. Then, if any of the sectors has a single symbol error, the control circuit 11 sends status information of "pass" back to the flash memory control unit 8.

Now, a fourth embodiment of the invention will be described also by referring to FIGS. 2A through 2C, FIG. 6 and FIG. 7. In this embodiment, a 2-valued memory system is used to store a one bit data in each memory cell of the flash memory. As shown in FIG. 6, data D0-x and data D1-x (x=0, 1, ..., 2047) are stored in a memory cell.

In this embodiment, the error detection/correction unit 7 generates check codes C0-1 through C0-42 and C1-1 through C1-42 for data D0-0 through D0-2047 and D1-0 through D1-2047 so that n bits may be corrected.

With this arrangement, errors can be corrected if up to n memory cells become defective. The number of bits that can be corrected is limited by the check code length. While the check code length is equal to 86 bits in the above instance, the check code length can be made greater than 86 by increasing the number of memory cells depending on the value of n if necessary.

Logical addresses A0 through A5 in each of LA0 through LA6 are stored in six memory cells. In other words, 7 sets of same address data (LA0 through LA6) are provided. As a result, up to 3 bits can be corrected for an address data Az (z=0 through 5) on the basis of majority logic. Thus, it will be appreciated that up to 3 defective memory cells can be remedied. The number of correctable bits can be increased by increasing the number of address data sets.

Keeping the above discussed data arrangement in mind, now a principal part of the fourth embodiment will be described below by referring to FIGS. 2A through 2C, FIG. 6 and FIG. 7.

The control circuit 11 erases the cluster in question and checks the erased state of the cluster (an operation including VERIFY/ERASE).

After the erasing operation, if the control circuit 11 determines that there are one or more than one sectors that contain m ($2 \leq m \leq n+1$) or more than m memory cells where the stored data have not been erased or there can be one or more than one sectors that contain m ($2 \leq m \leq n+1$) or more than m memory cells where the stored data has not been erased, it concludes that the normal erase operation has not been carried out successfully for the cluster and sends a "fail" status message back to the flash memory control unit 8.

For example, if n=2 and m=3, the system can correct errors of up to three memory cells for each sector. Assume here that each sector is allowed to make a memory cell error at the time of an erase operation so that the operation is carried out as normal erase operation. Then, if any of the sectors has a single error, the control circuit 11 sends status information of "pass" back to the flash memory control unit 8.

The control circuit 11 writes data in sectors and check the written state of each of the sectors (including an optical of VERIFY/WRITE). If the control circuit 11 determines that there are m ($2 \leq m \leq n+1$) or more than m errors, it concludes that the normal write operation has not been carried out successfully for the sector and sends a "fail" status message back to the flash memory control unit 8.

For example, if n=2 and m=3, the system can correct up to three bit errors for each sector. Assume here that each sector is allowed to make a memory cell error at the time of an write operation so that the operation is carried out as normal write operation. Then, if any of the sectors has a single error, the control circuit 11 sends status information of "pass" back to the flash memory control unit 8.

Figure 8:
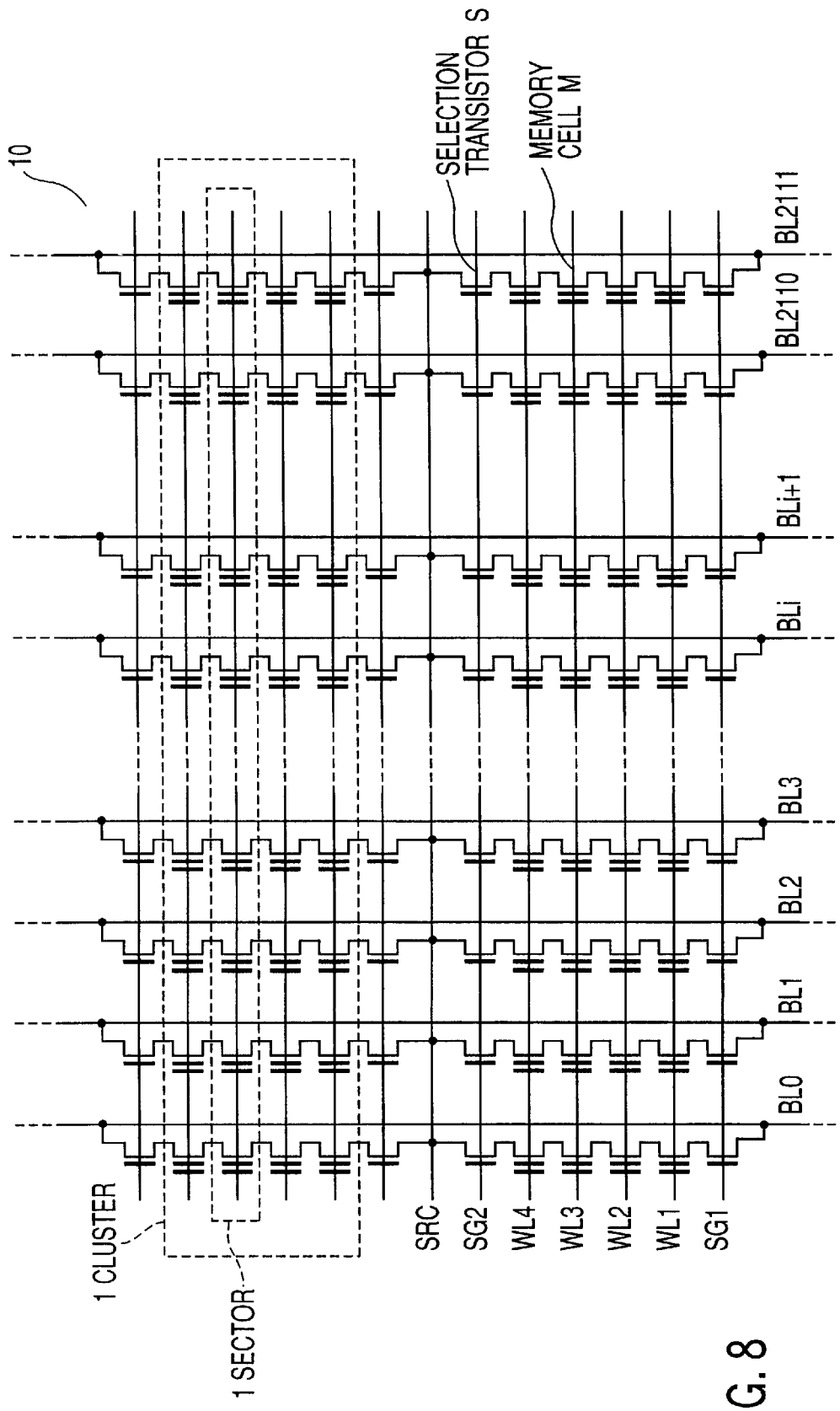
FIG. 8 is a schematic circuit diagram of a memory cell array of a flash memory.

FIG. 8 is a schematic circuit diagram of a memory cell array of a flash memory according to the invention. Note that FIG. 8 shows part of the cell array 10 of FIG. 6 and FIG. 1. Four memory cells M are connected in series and the opposite ends of the four memory cells are connected to a bit line barrel-like and a source line SRC by way of respective selection transistors S. They are referred to as NAND type memory cells. Each memory cell is adapted to store a data of two bits.

Each sector comprises a total of 2,112 memory cells connected to a single word line and stores 4,224 bits data in a manner as illustrated in FIG. 7. Each cluster comprises fur sectors sandwiched by a pair of selection transistors. A write or read operation is conducted on a sector by sector basis and an erase operation is conducted on a cluster by cluster basis.

A number of NAND type memory cells M are connected in series. If one of the memory cells connected in series gives rise to an error, all the memory cells M connected in series are deemed to be defective. For example, if four memory cells are connected in series and one of them becomes defective and no longer electrically conductive, all the remaining three memory cells are also deemed to be no longer electrically conductive.

With such an arrangement of memory cells, the control circuit 11 of FIG. 1 (or that of FIG. 6) cannot discriminate the defective memory cell and the other three memory cells. Then, it determines that each of the memory cells (1 NAND cell) becomes defective.

In view of this fact, it may be appreciated that a cluster (or a sector) does not necessarily have to be disabled if it gives rise to an error and may often operate properly as normal cluster (or sector). Therefore, excessive occurrences of defective sectors and those of defective clusters can be suppressed for NAND type cells by applying the method of the present invention. As a result, any unnecessary increase of disabled memory areas in a memory system of the type under consideration can be suppressed to consequently reduce the rate of occurrence of faulty systems.

Figure 9:
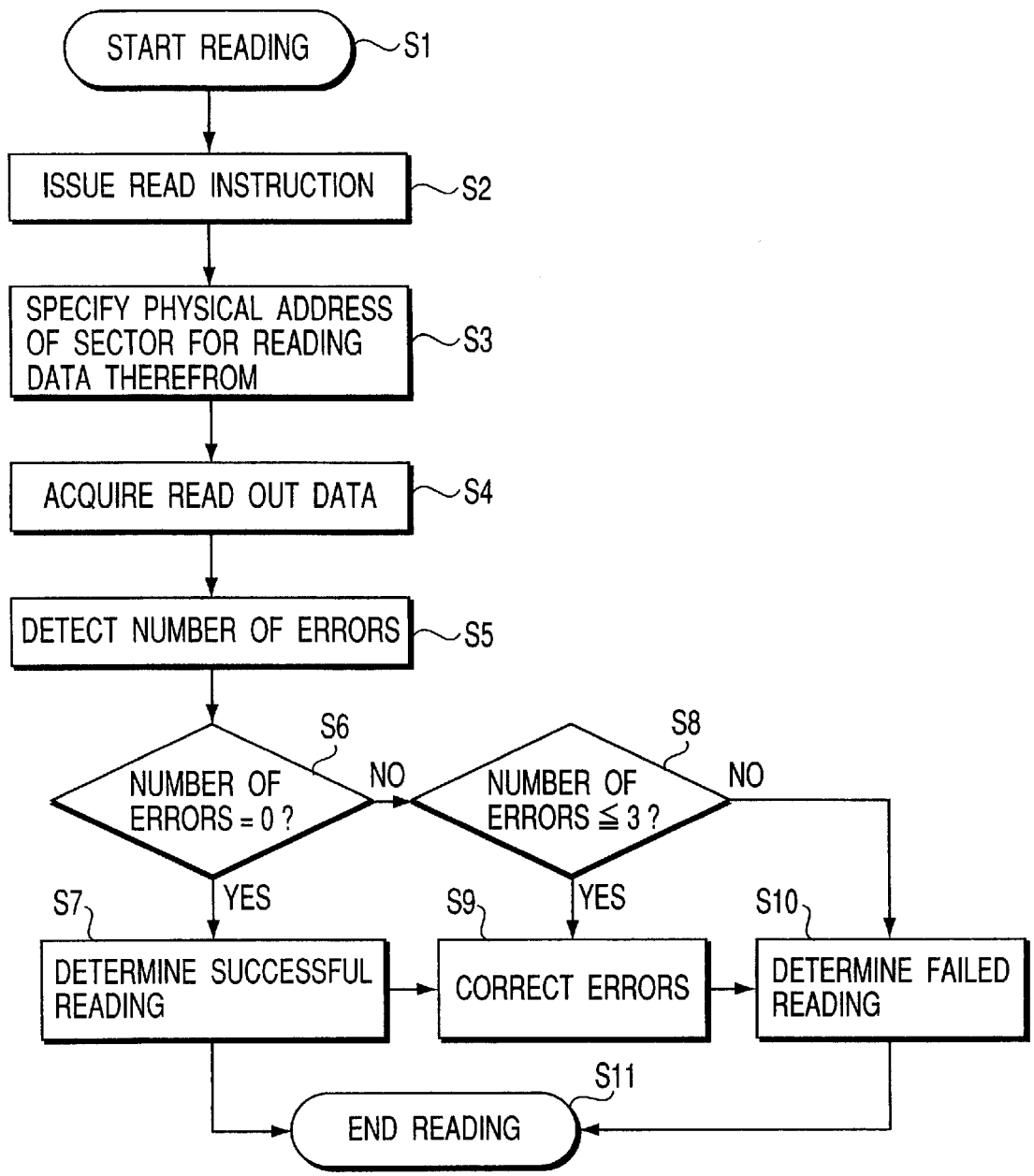
FIG. 9 is a flow chart of the algorithm of the operation of the memory system of FIG. 1 in a read mode, the flow chart being applicable to the fifth embodiment of the invention.
Figure 10:
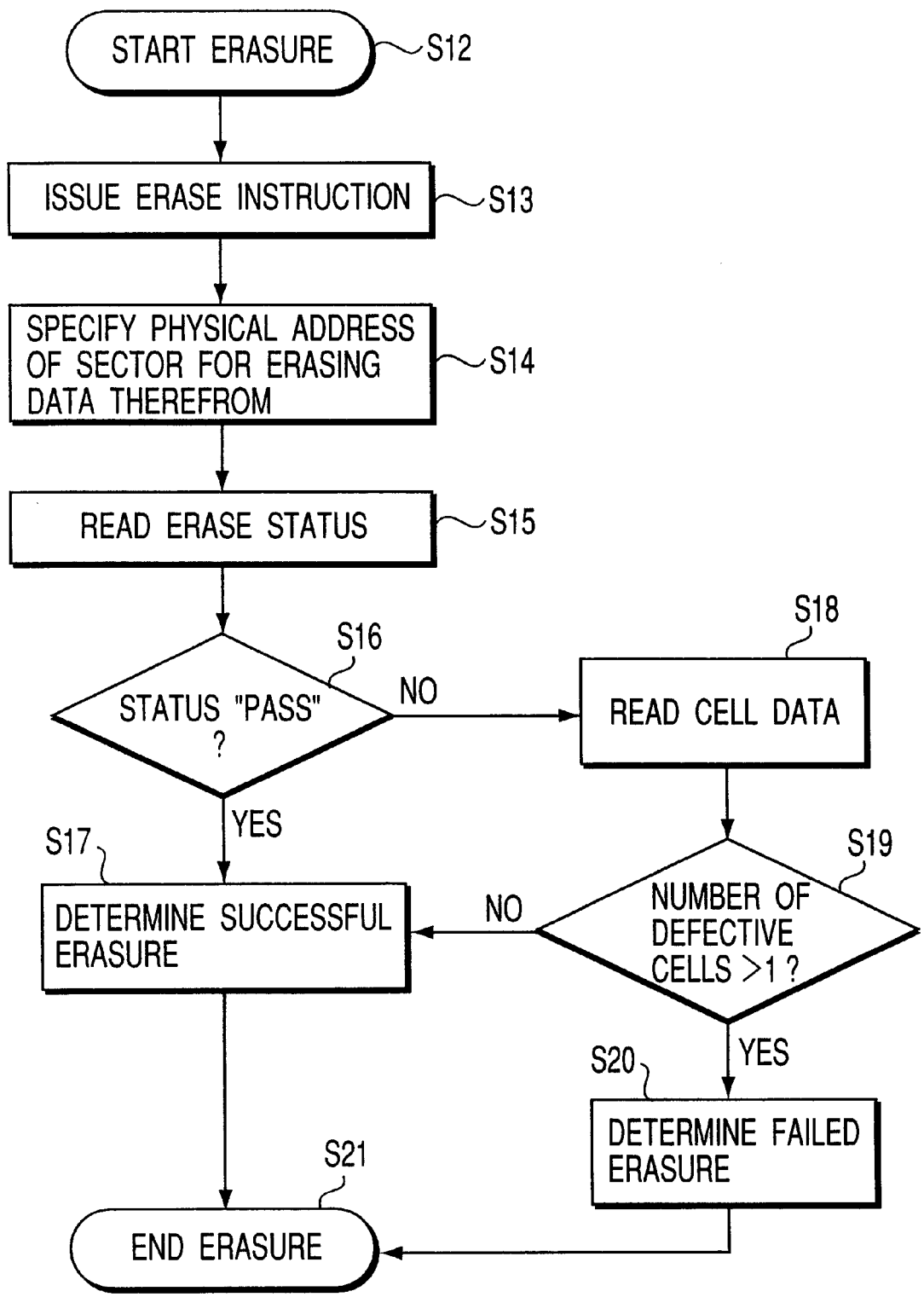
FIG. 10 is a flow chart of the algorithm of the operation of the memory system of FIG. 1 in an erase mode, the flow chart being applicable to the fifth embodiment of the invention.

FIG. 9, FIG. 10 and FIG. 11 are flow charts of the algorithms of the operations of the memory system of FIG. 1 in different modes, the flow charts being applicable to the fifth embodiment of the invention. FIG. 9 is for a read mode and FIG. 10 is for an erase mode of operation of the memory system, whereas FIG. 11 is for a write mode of operation.

Firstly, the algorithm of the operation of the memory system in a read mode will be described by referring to FIG. 9. Upon receiving a read request from the host computer, the system starts a read operation (Step S1). Then, the flash memory control unit 8 issues a read instruction to the flash memory 9 (Step S2). Subsequently, as the physical address of the sector from which a data is be read is specified (Step S3), the control circuit 11 outputs the data from the corresponding cell array 10 to the flash memory control unit 8 so that the flash memory control unit 8 acquires the data (Step S4).

The flash memory control unit 8 transfers the data to error detection/correction unit 7, which error detection/correction unit 7 by turn detects the number of errors in the sector (Step S5). The number of errors is expressed in terms of number of bits if the error correction method uses a bit as unit and in terms of number of symbols if the error correction method uses a symbol as unit.

The existence or non-existence of an error is detected (Step S6) and, if it is determined that there is no error (Step S7) as a result of the detection, the data read out from the flash memory 9 is directly output to the host computer except the check code to terminate the read operation (Step S11).

If it is determined that there is at least an error, then it is determined if the number of errors is equal to or less than the number of correctable errors (3 in this embodiment) (Step S8) and if the number of errors is equal to or less than the number of correctable errors, the errors are corrected (Step S9). As a result, it is determined that the read operation is carried out successfully (Step S7) and the corrected data is output to the host computer except the check code to terminate the read operation (Step S11).

If the number of errors is more than the number of correctable errors, it is determined that the read operation is unsuccessful (Step S10) and the host computer is notified of the unsuccessful result to terminate the read operation (Step S11).

Now, the algorithm of the operation of the memory system in an erase mode will be described by referring to FIG. 10. Upon receiving an erase instruction from the host computer or when an erase instruction is issued from the MPU 2 prior to a data writing operation of the host computer, an erase operation starts (Step S12). Then, the flash memory control unit 8 issues an erase command to the flash memory 9 (Step S13). Subsequently, as the physical address of the cluster from which the data is erased is specified (Step S14), the control circuit 11 erases the data of the cluster having the specified physical address from the cell array 10 (an operation including VERIFY/ERASE).

The control circuit 11 checks if the erase operation is carried out successfully or not and prepares for outputting status information for the erase operation. Then, the flash memory control unit 8 reads out the status information for the erase operation from the flash memory 9 (Step S15).

The control circuit 11 determines if the status information is that of "pass" or not (Step S16). If the status information is that of "pass", it determines that the erase operation is carried out successfully (Step S17) and terminates the erase operation (Step S21). If the status information is not that of "pass", the flash memory control unit 8 reads out the data of the memory cells from the flash memory 9 (Step S18).

Then, the flash memory control unit 8 counts the number of errors by means of the counter provided for this purpose, using the data read out in Step S18. Then, it determines if the counted number is greater than 1 or not (Step S19) and if the counted number is not greater than 1, it determines that the erase operation is successfully carried out (Step S17) and terminates the erase operation (Step S21).

The error judgement section 81 of FIG. 1 is typically responsible for the operation of above Step S19. More specifically, the number of errors counted in terms of bits, cells or symbols in Step S19 depending on the error correction method used in the system. If the counter number of errors is greater than 1, the section 81 determines that the erase operation is not successful (Step S20) and the MPU 2 disables the cluster and terminates the erase operation.

Now, the algorithm of the operation of the memory system in a write mode will be described by referring to FIG. 11. Upon receiving a write instruction from the host computer, a write operation starts (Step S22). Then, the error detection/correction unit 7 generates a check code from the data input by the host computer (Step S23). The flash memory control unit 8 issues a write command to the flash memory 9 (Step S24). Subsequently, the physical address of the sector where a data is written is specified (Step S25) and the data to be written, the check code and the physical address are input to the flash memory 9 (Step S26).

Then, the control circuit 11 writes the data onto the sector of the cell array 10 having the specified physical address. The control circuit 11 checks if the write operation is carried out successfully or not and prepares for outputting status information for the write operation. Then, the flash memory control unit 8 reads out the status information for the write operation from the flash memory 9 (Step S27).

The control circuit 11 determines if the status information is that of "pass" or not (Step S28). If the status information is that of "pass", it determines that the write operation is carried out successfully (Step S29) and terminates the write operation (Step S33). If the status information is not that of "pass", the flash memory control unit 8 reads out the data of the memory cells from the flash memory 9 (Step S30).

Then, the flash memory control unit 8 counts the number of errors by means of the counter provided for this purpose, using the data read out in Step S30. Then, it determines if the counted number is greater than 1 or not (Step S31) and if the counted number is not greater than 1, it determines that the write operation is successfully carried out (Step S29) and terminates the write operation (Step S33).

The error judgement section 81 of FIG. 1 is typically responsible for the operation of above Step S31. More specifically, the number of errors counted in terms of bits, cells or symbols in Step S31 depending on the error correction method used in the system. If the counter number of errors is greater than 1, the section 81 determines that the write operation is not successful (Step S20) and the MPU 2 disables the cluster and terminates the write operation.

In any of the above described embodiments of error correctable flash memory system according to the invention, there are provided groups of memory units, each comprising a plurality of flash memory cells where data are erased or written, and errors can be detected and corrected out of the data read out from the groups of memory units if the number of errors is found below a predetermined level. When the data of the groups of memory units are modified and the data stored in the groups of memory units are checked for the state in which the data are stored, errors may be detected because the data are not stored in a desired state. However, if the number of errors is found below a predetermined level and hence can be detected and corrected, the system deems that the data are stored in the groups of memory units in a desired state.

Thus, in a flash memory system according to the invention, if the number of errors produced as a result of an erase or write operation is below a predetermined level and hence can be corrected, it deems that the erase or write operation is successful. As a result, any unnecessary increase of disabled memory areas in a flash memory system according to the invention can be suppressed to consequently reduce the rate of occurrence of faulty systems and improve the reliability.

In the embodiments of the invention, the functions of the error judgement section and the error detection/correction unit can be also realized by software. As well as the above-described methods, the functions of the error judgement section and the error detection/correction unit can be also realized, using a computer-readable recording medium that stores programs for enabling the computer to execute predetermined functions. The present invention is by no means limited to the above embodiments. The flash memory may not necessarily comprise NAND type memory cells. It may alternatively comprise NOR type memory cells, virtual grand memory cells or memory cells of some other type.

While each cluster comprises four sectors in the above description, it may alternative comprise eight, nine, sixteen or more sectors depending on the desired characteristics of the system. Still alternatively, a cluster may comprise only a sector.

When a memory cell is designed to store a $2^k$ value ($k \geq 2$), it is possible to allow the presence of a total of k n-bit logical sectors in n memory cell groups. Thus, the present invention is feasible when memory sectors do not show a 1 to 1 correspondence relative to physical memory cell groups.

The present invention can be modified or altered in various different ways without departing from the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of controlling a flash memory system comprising the steps of:
    modifying data of a group of flash memory cells adapted to erasing data therefrom and writing data therein;
    checking for the presence or absence of an error of not properly modifying said data of said group of memory units; and
    determining the completion of proper modification of said data of said group of memory units provided that an error is detected and said error can be corrected.

2. A method of controlling a flash memory system comprising steps of:
    erasing data written in a group of flash memory cells adapted to erasing data therefrom and writing data therein;
    reading the data written in said group of memory units having said data erased and checking the completion of proper erasure of said data;
    counting the number of errors of not being properly erased provided that said data are not properly erased as a result of said checking step; and
    determining completion of proper erasure of said data of said group of memory units provided that the counted number of errors is within a correctable range.

3. A method of controlling a flash memory system comprising steps of:
    writing data in a group of memory units, each having a plurality of flash memory cells adapted to erasing data therefrom and writing data therein;
    reading the data written in said group of memory units and checking the completion of proper writing of said data;
    counting the number of errors of not being properly written provided that said data are not properly written as a result of said checking step; and
    determining the completion of proper writing of said data of said group of memory units provided that the counted number of errors is within a correctable range.

4. A flash memory system comprising:
    a group of memory units, each having a plurality of flash memory cells adapted to erasing data therefrom and writing data therein;
    an error detection unit for reading the data written in said group of memory units and detecting errors; and
    an error judgement section for counting the number of errors detected by said error detection unit and determining the completion of proper data modification of data provided that the number of errors detected by said error detection unit is not greater than a number which can be corrected in accordance with an error check code.

5. A flash memory system comprising:
    a memory cluster having a plurality of flash memory cells adapted to erasing data therefrom and writing data therein;
    at least one or more than one memory sectors constituting said memory cluster;
    a flash memory control unit for ordering erasure of the data written in said memory cluster;
    an error detection/correction unit for detecting erase errors in the data read from said memory cluster and correcting erase errors up to n (n is a number of memory cells in a memory sector, that can be corrected in accordance with an error check code) attribute to memory cells; and
    an error judgement section for counting the erase errors of each memory sector and determining the completion of proper data erasure provided that the completion of proper data erasure provided that the number of memory cells storing unerased data is not greater than m ($1 \leq m \leq n$) in each and every memory sector.

6. A flash memory system comprising:
    a memory cluster having a plurality of flash memory cells adapted to erasing data therefrom and writing data therein;
    at least one or more than one memory sectors constituting said memory cluster;
    a flash memory control unit for ordering erasure of the data written in said memory cluster;
    an error detection/correction unit for detecting erase errors in the data read from said memory cluster and correcting erase errors up to n (n is a number of symbols in a memory sector that can be corrected in accordance with an error check code (1 symbol=k bits, $k \geq 2$)) symbols attributable to the data;
    a counter unit for counting the number of symbols showing erase errors and contained in each memory sector; and an error judgement section for determining the completion of proper data modification provided that the number of symbols showing erase errors is not greater than m (1≦m≦n) in each and every memory sector.

7. A flash memory system comprising:

a memory cluster comprising a plurality of external flash memory cells;

at least one or more than one memory sector constituting said memory cluster;

a flash memory control unit for ordering writing of the data in said memory sectors;

an error detection/correction unit for detecting errors in the data read from said memory cluster and correcting erase errors up to n (n is the number of memory cells in a memory sector, that can be corrected in accordance with an error check code) attributable to flash memory cells; and an error judgement section for counting the number of memory cells defective in terms of writing and contained in each memory sector and determining the completion of proper data writing provided that the number of memory cells defective in terms of writing is not greater than n in each and every memory sector.

8. A flash memory system comprising:

memory sectors having a plurality of flash memory cells;

a flash memory control unit for ordering writing of the data in each of said memory sectors;

an error detection/correction unit for detecting write errors in the data read from said memory cluster and correcting write errors up to n (n is a number of symbols in a memory sector, that can be corrected in accordance with an error check code (1 symbol=k bits, k≧2) symbols (1 symbol=k bits, k≧2) attributable to the data;

an error judgement section for counting the number of symbols defective in terms of writing as detected by said detection unit aid and determining the completion of proper data modification provided that the number of symbols showing errors is not greater than m (1≦m≦n) in each and every memory sector.

9. A flash memory system comprising:

a memory cluster comprising a plurality of external flash memory cells;

at least one or more than one memory sectors constituting said memory cluster;

a flash memory control unit for ordering writing of the data in said memory sectors;

an error detection/correction unit for detecting write errors in the data read from said memory cluster and correcting write errors up to n (n is a number of bits in a memory sector, that can be corrected in accordance with an error check code) bits attributable to the data; and an error judgement section for counting the number of bits showing write errors and determining the completion of proper data writing provided that the number of bits showing write errors is not greater than m (1≦m≦n) bits in each and every memory sector.

10. A flash memory system comprising:

a memory unit, including a plurality of flash memory cells, for storing data which can be electrically changed;

a control circuit for reading out the data stored in said memory unit and for controlling said memory unit in order to change the data stored in said memory unit;

an error detection and correction unit for detecting whether an error has been occurred in read-out data read out by said control circuit and for correcting errors in the read-out data;

an error judgement section, being implemented independent of said error detection and correction unit, for counting the number of failure data regarded as having not been successfully stored in the memory unit;

wherein said flash system settles that changing of data has been successfully done if the number of failure data is not larger than predetermined number, said predetermined number satisfying the condition that the predetermined number of failure data can be corrected by said error detection and correction unit.

11. The flash memory system according to claim 10, wherein said predetermined number is one.

12. The flash memory system according to claim 10, wherein a data length of each data stored in said memory unit is one bit.

13. The flash memory system according to claim 10, wherein a data length of each data stored in said memory unit is larger than one bit.

14. A flash memory device comprising:

a memory unit, including a plurality of flash memory cells, for storing data which can be electrically changed;

a control circuit for reading out the data stored in said memory unit and for controlling said memory unit in order to change the data stored in said memory unit;

an error judgement section, being included in said control circuit, for counting the number of failure data regarded as having not been successfully stored in the memory unit;

wherein, if the number of failure data is not larger than predetermined number, said control circuit outputs status data which means that changing of data has been successfully done.

15. The flash memory device according to claim 14, wherein said predetermined number is one.

16. The flash memory device according to claim 14, wherein a data length of each data stored in said memory unit is one bit.

17. The flash memory device according to claim 14, wherein a data length of each data stored in said memory unit is larger than one bit.

18. A flash memory device comprising:

a group of memory units, each having a plurality of flash memory cells adapted to erasing data therefrom and writing data therein; and an error judgement section for determining the completion of proper data modification of data provided that the number of errors detected by an error detection/correction unit detecting/correcting errors in the data written in said group of memory units is not greater than a number of errors within a correctable range.

19. A flash memory device comprising:

a group of memory units, each having a plurality of flash memory cells adapted to erasing data therefrom and writing data therein;

an error detection unit for reading the data from said group of memory units and detecting errors; and an error judgement section for counting the number of errors detected by said error detection unit and determining the completion of proper data modification of data provided that the number of errors detected by said error detection unit is not greater than a number which can be corrected in accordance with an error check code.

20. A computer-readable recording medium storing a program for realizing in a computer:
   a function of ordering modification of data to an external memory device containing a group of memory units, each having a plurality of flash memory cells adapted to erasing data therefrom and writing data therein; and
   a function of checking for the presence or absence of an error of not properly modifying said data of said group of memory units and determining the completion of proper modification of said data of said group of memory units provided that an error is detected and said error can be corrected.

21. A computer-readable recording medium storing a program for realizing in a computer;
   a function of ordering erasure of the data written in a group of memory units, each having a plurality of flash memory cells adapted to erasing data therefrom and writing data therein; and
   a function of reading the data written in said group of memory units having said data erased and checking the completion of proper erasure of said data, counting the number of errors of not being properly erased provided that said data are not properly erased as a result of said checking step and determining the completion of proper erasure of said data of said group of memory units provided that the counted number of errors is within a correctable range.

22. A computer-readable recording medium storing a program for realizing in a computer;
   a function of ordering writing of data written in a group of memory units, each having a plurality of flash memory cells adapted to erasing data therefrom and writing data therein; and
   a function of reading the data written in said group of memory units and checking the completion of proper writing of said data counting the number of errors of not being properly written provided that said data are not properly written as a result of said checking step and determining the completion of proper writing of said data of said group of memory units provided that the counted number of errors is within a correctable range.

23. A flash memory system comprising:
   a flash memory cell array;
   a control circuit for erasing data from designated part of said memory cell array, for writing data into given part of said memory cell array, and for reading data from said designated or given part of said memory cell array, thereby it can be detected how many errors have been occurred within said designated or given part of said memory cell array after erasing or writing;
   a counter for counting the number of the errors based on data read by said control circuit after the erasing or writing;
   an error judgement section for outputting information that it is successfully erased or written if the number counted is smaller than a number which can be corrected in accordance with an error check code; and
   an error detection/correction unit equipped beside said counter and said error judgement section for generating said error check code accompanying with data to be written into said given part of said memory cell array, said error check code being also written into said given part, and for correcting errors existing in data read from said designated or given part of said memory cell array.

24. The flash memory system according to claim 23, wherein said number can be corrected in accordance with an error check code, that is one.

25. The flash memory system according to claim 23, wherein data stored in said memory cell array is divided into a plurality of symbols (1 symbol=k bits; k>0), said counter counts the number of the errors in increments of one of said symbols, and if any one bit among one symbol is failed in erasing or writing, said counter assumes that such symbol is an error.

26. The flash memory system according to claim 25, wherein said number that can be corrected in accordance with an error check code is one.

27. A flash memory device comprising:
   a flash memory cell array;
   a control circuit for erasing data from designated part of said memory cell array, for writing input data and check code incidental to said input data into given part of said memory cell array, said input data being also input from external, and for reading data from said designated or given part of said memory cell array, thereby it can be detected how many errors have been occurred within said designated or given part of said memory cell array after erasing or writing;
   a counter for counting the number of the errors based on data read by said control circuit after the erasing or writing; and
   an error judgement section for outputting information that it is successfully erased or written if the number counted is smaller than a number can be corrected in accordance with an error check code;
   wherein if read instruction and address are input to the flash memory device, the input data and the check code stored in part of said memory cell array addressed by said address are read out by said control circuit and output to external without any modification.

28. The flash memory device according to claim 27, wherein said number that can be corrected in accordance with an error check code within a correctable range is one.

29. The flash memory device according to claim 27, wherein data stored in said memory cell array is divided into a plurality of symbols (1 symbol=k bits; k>0), said counter counts the number of the errors in increments of one of said symbols, and if any one bit among one symbol is failed in erasing or writing, said counter assumes that such symbol is an error.

30. The flash memory device according to claim 29, wherein said number can be corrected in accordance with an error check code, that is one.

* * * * *